(12) United States Patent
Kim et al.

(10) Patent No.: US 7,061,122 B2
(45) Date of Patent: Jun. 13, 2006

(54) COMPONENTS, METHODS AND ASSEMBLIES FOR MULTI-CHIP PACKAGES

(75) Inventors: Young-Gon Kim, Cupertino, CA (US); David Gibson, Lake Oswego, OR (US); Michael Warner, San Jose, CA (US); Philip Damberg, Cupertino, CA (US); Philip Osborn, Mountain View, CA (US)

(73) Assignee: Tessera, Inc., San Jose, CA (US)

(*) Notice: Subject to any disclaimer, the term of this patent is extended or adjusted under 35 U.S.C. 154(b) by 0 days.

(21) Appl. No.: 10/683,097

(22) Filed: Oct. 10, 2003

(65) Prior Publication Data
US 2004/0262777 A1 Dec. 30, 2004

Related U.S. Application Data

(60) Provisional application No. 60/418,241, filed on Oct. 11, 2002.

(51) Int. Cl.
*H01L 29/40* (2006.01)

(52) U.S. Cl. ........................ 257/778; 257/700

(58) Field of Classification Search ............... 257/737, 257/738, 778, 700
See application file for complete search history.

(56) References Cited

U.S. PATENT DOCUMENTS

| | | | |
|---|---|---|---|
| 4,558,397 A | 12/1985 | Olsson |
| 4,897,918 A | 2/1990 | Osaka et al. |
| 4,982,265 A | 1/1991 | Watanabe et al. |
| 5,117,282 A | 5/1992 | Salatino |
| 5,148,265 A | 9/1992 | Khandros et al. |
| 5,148,266 A | 9/1992 | Khandros et al. |
| 5,172,303 A | 12/1992 | Bernardoni et al. |
| 5,222,014 A | 6/1993 | Lin |
| 5,247,423 A | 9/1993 | Lin et al. |
| 5,376,825 A | 12/1994 | Tukamoto et al. |
| 5,384,689 A | 1/1995 | Shen |
| 5,543,664 A | 8/1996 | Burns |
| 5,608,265 A | 3/1997 | Kitano et al. |
| 5,616,958 A | 4/1997 | Laine et al. |
| 5,637,536 A | 6/1997 | Val |
| 5,639,695 A | 6/1997 | Jones et al. |
| 5,642,261 A | 6/1997 | Bond et al. |
| 5,659,952 A | 8/1997 | Kovac et al. |
| 5,668,405 A | 9/1997 | Yamashita |
| 5,677,566 A | 10/1997 | King et al. |
| 5,679,977 A | 10/1997 | Khandros et al. |
| 5,783,870 A | 7/1998 | Mostafazadeh et al. |

(Continued)

FOREIGN PATENT DOCUMENTS

WO    WO-03/019654    3/2003

OTHER PUBLICATIONS

Bang, U.S. Appl. No. 10/656,534, filed Sep. 5, 2003.

(Continued)

*Primary Examiner*—Roy Potter
(74) *Attorney, Agent, or Firm*—Lerner, David, Littenberg, Krumholz & Mentlik, LLP

(57) ABSTRACT

An ultra thin system-in-a-package (SIP) with independent test and repair capability comprises an interposer having arranged on a top surface and a bottom surface thereof a number of packaged semiconductor chips mounted via solder bumps in accordance with a Land Grid Array (LGA) format and wherein no underfill is used on the SIP.

27 Claims, 12 Drawing Sheets

U.S. PATENT DOCUMENTS

| | | | |
|---|---|---|---|
| 5,784,264 A | 7/1998 | Tanioka | |
| 5,801,072 A | 9/1998 | Barber | |
| 5,834,339 A | 11/1998 | Distefano et al. | |
| 5,844,315 A | 12/1998 | Melton et al. | |
| 5,861,666 A | 1/1999 | Bellaar | |
| 5,883,426 A | 3/1999 | Tokuno et al. | |
| 6,054,756 A | 4/2000 | Distefano et al. | |
| 6,072,233 A | 6/2000 | Corisis et al. | |
| 6,093,029 A | 7/2000 | Kwon et al. | |
| 6,180,881 B1 | 1/2001 | Isaak | |
| 6,232,152 B1 | 5/2001 | Distefano et al. | |
| 6,268,649 B1 | 7/2001 | Corisis et al. | |
| 6,291,259 B1 | 9/2001 | Chun | |
| 6,303,997 B1 | 10/2001 | Lee | |
| 6,313,522 B1 | 11/2001 | Akram et al. | |
| 6,335,565 B1 | 1/2002 | Miyamoto et al. | |
| 6,342,728 B1 | 1/2002 | Miyazaki et al. | |
| 6,365,975 B1 * | 4/2002 | DiStefano et al. | 257/777 |
| 6,369,445 B1 | 4/2002 | Khoury | |
| 6,417,688 B1 * | 7/2002 | Dabral et al. | 326/30 |
| 6,462,421 B1 * | 10/2002 | Hsu et al. | 257/777 |
| 6,496,026 B1 | 12/2002 | Long et al. | |
| 6,515,870 B1 | 2/2003 | Skinner et al. | |

OTHER PUBLICATIONS

Bang, U.S. Appl. No. 60/408,644, filed Sep. 6, 2002.
Forthun, U.S. Appl. No. 07/552,578, filed Jul. 13, 1990.
Mohammed, Serial No. PCT/US02/26805, filed Aug. 22, 2002.
Newsam, U.S. Appl. No. 60/314,042, filed Aug. 22, 2001.

* cited by examiner

US 7,061,122 B2

COMPONENTS, METHODS AND ASSEMBLIES FOR MULTI-CHIP PACKAGES

CROSS-REFERENCE TO RELATED APPLICATION

This application claims benefit of U.S. Provisional Patent Application Ser. No. 60/418,241, filed Oct. 11, 2002, the disclosure of which is hereby incorporated by reference herein.

The U.S. government has a paid-up license in this invention and the right in limited circumstances to require the patent owner to license others on reasonable terms as provided for by the terms of Contract No. MD-A-904-02-C-1351 awarded by the National Security Agency.

BACKGROUND OF THE INVENTION

The present invention relates to microelectronic assemblies and to components and methods used for making the same.

Microelectronic elements such as semiconductor chips ordinarily are mounted on circuit panels such as circuit boards. For example, a packaged semiconductor chip may have an array of bonding contacts on a bottom surface of the package. Such a package can be mounted to a corresponding array of bonding contacts exposed at a top surface of a circuit board by placing the package on the circuit board with the bottom surface of the package facing downwardly and confronting the top surface of the circuit board, so that each bonding contact on the package is aligned with a corresponding bonding contact on the circuit board. Masses of a conductive bonding material—mounting masses—typically in the form of solder balls, are provided between the bonding contacts of the package and the bonding contacts of the circuit board. In typical surface-mounting techniques, solder balls are placed on the bonding contacts of the package before the package is applied to the circuit board.

Ordinarily, numerous microelectronic elements are mounted side-by-side on the circuit board and interconnected to one another by electrically conductive traces connecting the various bonding contacts. Using this conventional approach, however, the circuit board must have an area at least equal to the aggregate area of all of the microelectronic elements. Moreover, the circuit board must have all of the traces needed to make all of the interconnections between microelectronic elements. In some cases, the circuit board must include many layers of traces to accommodate the required interconnections. This materially increases the cost of the circuit board. Typically, each layer extends throughout the entire area of the circuit board. Stated another way, the number of layers in the entire circuit board is determined by the number of layers required in the area of the circuit board having the most complex, densely packed interconnections. For example, if a particular circuit requires six layers of traces in one small region but only requires four layers in the remainder of the circuit board, the entire circuit board must be fabricated as a six-layer structure.

These difficulties can be alleviated to some degree by connecting related microelectronic elements to one another using an additional circuit panel so as to form a sub-circuit or module, also referred to herein as a "multi-chip module" or MCM. The multi-chip module, in turn, is mounted to the main circuit board. The main circuit board need not include the interconnections made by the circuit panel of the module. It is possible to make such a multi-chip module in a "stacked" configuration, so that some of the packaged chips or other microelectronic elements in the module are disposed on top of other chips or microelectronic elements in the same module. Thus, the multi-chip module as a whole can be mounted in an area of the main circuit board less than the aggregate area of the individual microelectronic elements in the module. However, the additional circuit panel and the additional layer of interconnections between this circuit panel and the main circuit board consume additional space. In particular, the additional circuit panel and additional layer of interconnections between the additional circuit panel and the main circuit panel add to the height of the multi-chip module, e.g., the distance by which the module projects above the top surface of the main circuit board. This is particularly significant where the module is provided in a stacked configuration and where low height is essential, as, for example, in assemblies intended for use in miniaturized cellular telephones and other devices to be worn or carried by the user.

The additional space consumed by mounting packaged semiconductor chips on a separate module circuit panel can be saved by integrating the circuit panel of the module with a part of the package itself, commonly referred to as a package substrate. For example, several bare or unpackaged semiconductor chips can be connected to a common substrate during the chip packaging operation. Packages of this nature can also be made in a stacked arrangement. Such multi-chip packages can include some or all of the interconnections among the various chips in the package and can provide a very compact assembly. The main circuit board can be simpler than that which would be required to mount individual packaged chips in the same circuit. Unfortunately, these types of packages are difficult to repair, let alone test, after assembly. In addition, this approach requires unique packages for each combination of chips to be included in the package. For example, in the cellular telephone industry, it is a common practice to use the same field programmable gate array ("FPGA") or application specific integrated circuit ("ASIC") with different combinations of static random access memory ("SRAM") and flash memory so as to provide different features in different cellular telephones. This increases the costs associated with producing, handling and stocking the various packages.

Thus, still further improvements in stacked chip assemblies would be desirable.

SUMMARY OF THE INVENTION

One aspect of the invention provides a separate circuit module, or multi-chip module (MCM), wherein packaged semiconductor chips are attached to both sides of an interposer using connections in accordance with a land grid array (LGA) connection. Most preferably, no underfill material is used in the joints between the packaged semiconductor chips and the interposer to provide low overall height for the MCM. It is another object of the invention to improve the test and repair capabilities of the multi-chip module.

Another aspect of the invention provides for an ultra-thin system-in-a-package (SIP) structure.

Another aspect of the invention provides a stacked electronic assembly comprising a plurality of multi-chip modules. Each multi-chip module further comprising packaged semiconductor chips attached to both sides of an interposer using LGA connections. No underfill material is used in the stacked electronic assembly.

Another aspect of the invention relates to methods of making multi-chip assemblies of the types described herein. A substrate comprises electrically conductive terminals accessible at both surfaces of the substrate. Most preferably, the terminals are disposed in accordance with an LGA pattern. The steps of making the multi-chip module include providing a substrate in the form of a flat sheet as described herein, assembling a plurality of packaged semiconductor chips to both surfaces of the substrate such that no underfill is applied to either surface of the multi-chip module.

Another aspect of the invention relates to methods of attaching a multi-chip module of the types described herein to a circuit board. In particular, a multi-chip module of the types described herein may be subject to warpage. The steps of making the circuit board include positioning a warped multi-chip module over a portion of a circuit board for attachment thereto; and reflowing the multi-chip module to remove the warpage. In particular, reflow is performed at a temperature that is within or above a temperature range window. The temperature range window relates to prior assembly of the multi-chip module and includes those temperatures used to cure solder masks, etc. By performing reflow at a temperature within or above the temperature window, the warped multi-chip module relaxes and becomes flatter for mounting to the circuit board.

DETAILED DESCRIPTION

Figure 1:
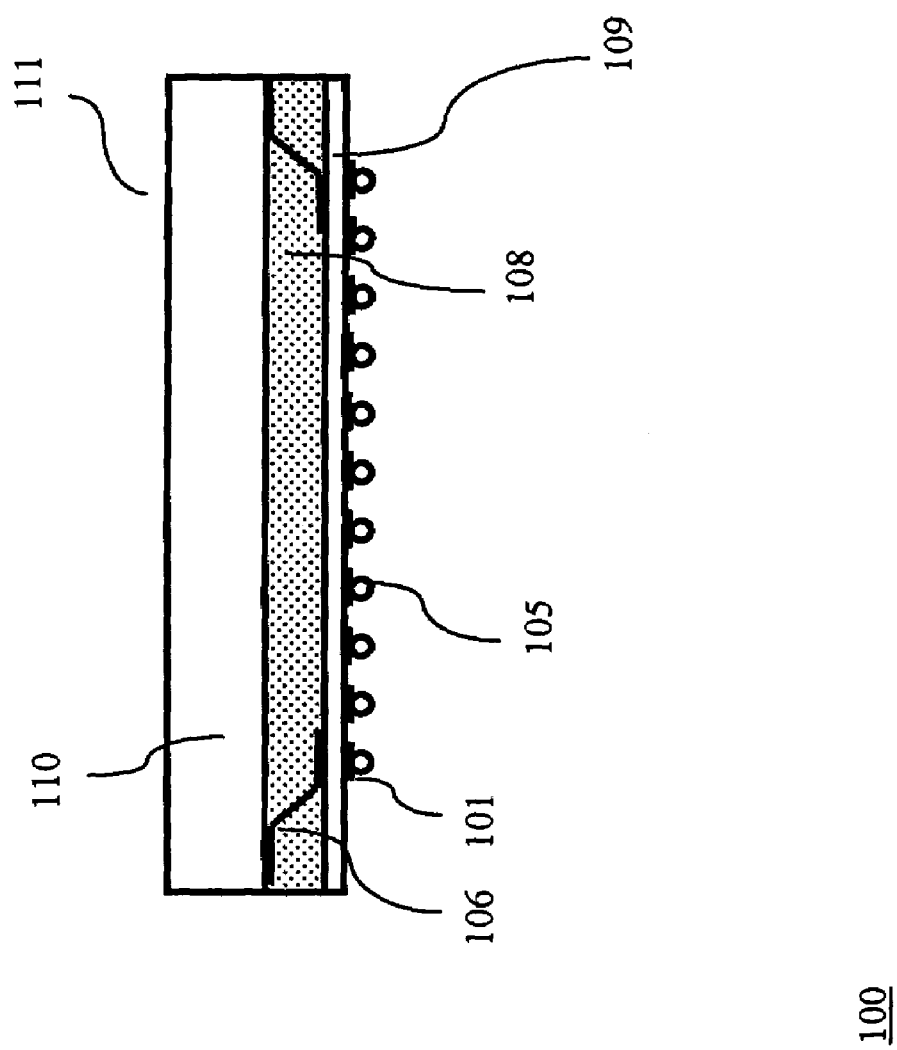
FIGS. 1 and 2 are illustrative diagrammatic views of packaged semiconductor chips.

A packaged semiconductor chip 100 is illustrated in FIG. 1. As used in this disclosure, the term "packaged semiconductor chip" refers to a unit including both the actual semiconductor element or "bare die" itself, and one or more components or layers which cover at least one surface or edge of the bare die. Typically, but not necessarily, a packaged chip has electrical connection elements distinct from the contacts of the bare die itself. As used in this disclosure, the term "standard packaged chip" refers to a packaged chip having electrical connection elements (whether or not distinct from the contacts of the bare die) disposed in a pattern conforming to an official or unofficial standard applicable to packaged chips. Most preferably, the standard packaged chips conform to a standard applicable to packaged chips intended for mounting to circuit boards. Illustratively, packaged semiconductor chip 100 is a Tessera® Compliant Chip as known in the art. However, other forms of packaged chips may be used in accordance with the principles of the invention.

Packaged semiconductor chip 100 comprises a chip, or bare die, 110 (i.e., the semiconductor device), which has bonding pads (not shown) that are electrically coupled, as represented by leads 106, to conductive traces (not shown) and terminals, or contact pads, 101 of a package substrate 109, which may be, for example, a flexible, or polyimide film. These terminals 101 and conductive traces are coupled to external circuitry (not shown) via solder masses, 105, which are attached to contact pads 101 and are used to electrically and mechanically bond the package to a circuit board (not shown). Packaged semiconductor chip 100 includes a compliant layer 108 that allows for some movement of terminals 101 relative to the die 110 to accommodate dimensional changes caused by the difference in the coefficient of thermal expansion (CTE) between materials. Illustratively, compliant layer 108 is an elastomer. However, it should be noted that other types of compliant layers may also be used and, also, that a compliant layer is not required. It should also be noted that top surface 111 of packaged chip 100 is formed from the top surface of chip 110, i.e., the surface remote from substrate 109.

Figure 2:
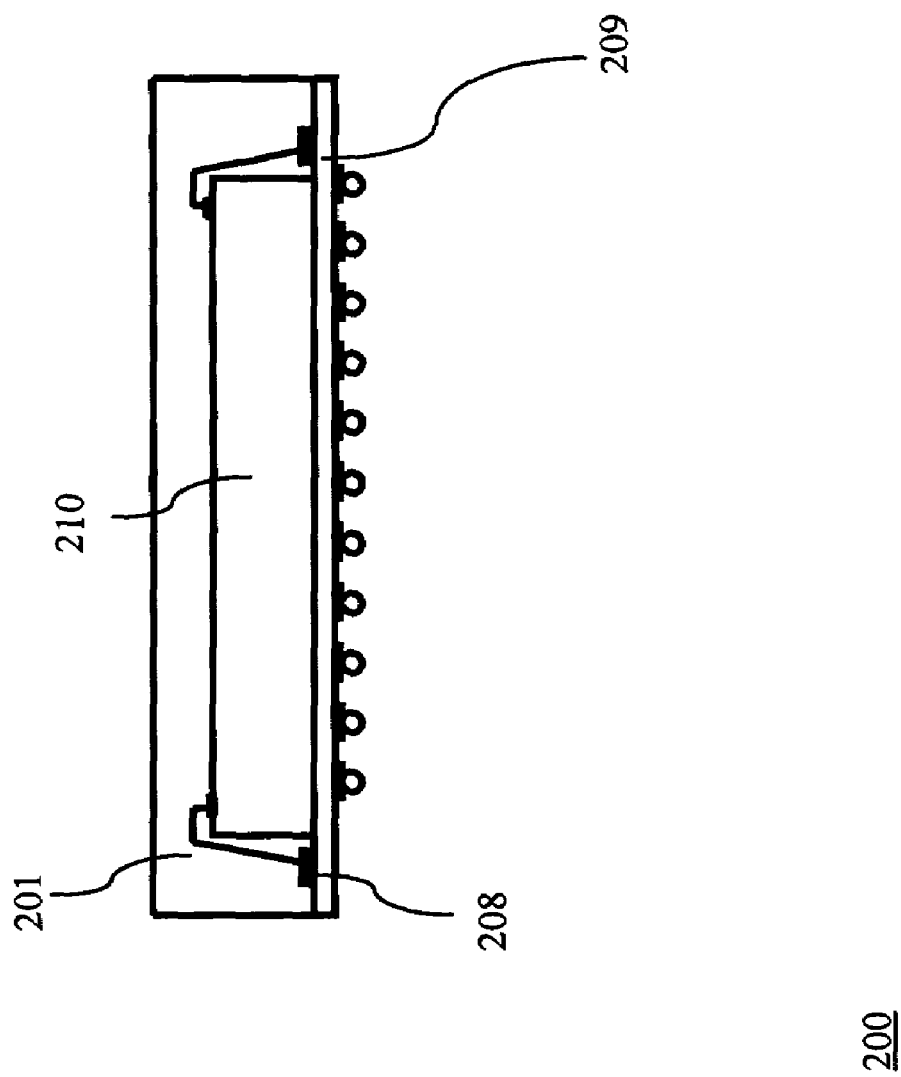

As noted above, other forms of packaged chips may be used in accordance with the principles of the invention. Another illustrative packaged semiconductor chip is shown in FIG. 2. Packaged semiconductor chip 200 is similar to packaged semiconductor chip 100 of FIG. 1 except that bare die 210 has its front or contact-bearing face facing upwardly, away from substrate 209, and there is no compliant layer. Bare die 210 is connected by wire bonds 201 to the bond pads 208 of substrate 209. Other illustrations of packages are disclosed, for example, in certain preferred embodiments of U.S. Pat. Nos. 5,148,265, 5,148,266, 5,679,977, 6,054,756, and 5,518,964, the disclosures of which are hereby incorporated by reference herein.

Figure 3:
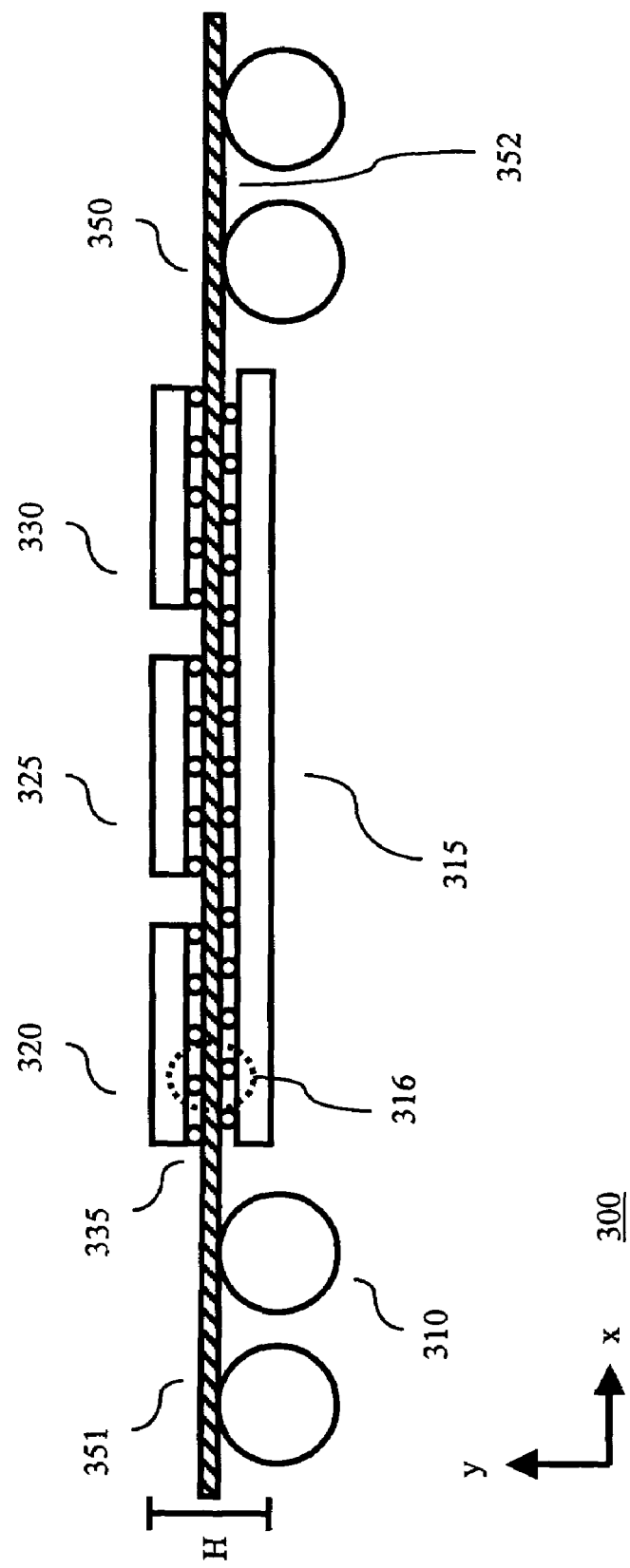
FIG. 3 is a diagrammatic view of a multi-chip module in accordance with the principles of the invention.

Turning now to FIG. 3, a diagrammatic view of a multi-chip module 300 in accordance with one aspect of the invention is shown. It should be noted that the figures are not to scale and dimensions therein have been exaggerated for the purposes of illustration. Multi-chip module 300 comprises a substrate or interposer 350 having a first or upper surface 351 and a second or lower surface 352. Interposer 350 incorporates a dielectric body which is desirably as thin as is practicable and which may be in the form of a flexible sheet. For example, the interposer may include one or more layers of dielectric such as polyimide, BT resin, epoxy or other polymers, which may incorporate reinforcements such as glass, carbon or polymeric fibers. Essentially any material that can be used in construction of rigid or flexible circuit boards. Interposer 350 comprises one or more conductive layers, or traces, (not shown) for electrically coupling the packaged devices (described below) to a circuit board (not shown) via solder balls 310 and, depending on the electrical design, for electrically coupling one or more of the packaged semiconductor chips together. The solder balls 310 should have a stand-off height that accommodates the presence of the bottom packaged semiconductor chip. Therefore, solder ball pitch should be relatively wide to get sufficient ball height after reflow. Illustratively, a diameter for solder balls 310 is on the order of 300 microns (micrometers). Although not shown, vertical interconnection of the packaged semiconductor chips may occur through a via structure in the interposer.

As further discussed herein, the thickness of the interposer contributes to the overall height in the y dimension of the completed assembly and accordingly it is preferred to make the thickness of the interposer as small as possible consistent with other requirements. Illustratively, interposer 350 has a body thickness, or height (including solder mask, metal layers, etc.), in the y dimension of less than about 75 microns, most desirably less than 40 microns and preferably about 25 microns, or less.

Mounted on top surface 351 of interposer 350 are a number of packaged semiconductor chips 320, 325 and 330. These packaged semiconductor chips (of the illustrative form shown in FIG. 1, although these specific types of packaging are not required for the inventive concept) are mounted to top surface 351 via mounting masses 335. Illustratively, the dimensions of mounting masses 335 are such that they lie relatively flat. That is, the thickness (e.g., the height) in the y dimension of a mounting mass is less than the thickness (e.g., the width) in the x dimension of the mounting mass. One illustration of such mounting masses are solder bumps, which are shown as small circles in FIG. 3. It should be noted that other forms of metal interconnect could also be used. The use of mounting masses 335 of this size facilitates the use of Land Grid Array (LGA) connections for mounting the packaged semiconductor chips. Illustratively, mounting masses 335 have a diameter on the order of 50 microns. In addition, mounted to the bottom surface 352 is packaged semiconductor chip 352, which is also illustratively mounted via solder bumps having a diameter on the order of 50 microns. It should be noted that although a plurality of packaged semiconductor chips are illustrated as being mounted to the top surface of the interposer and a single packaged semiconductor chip is illustrated as being mounted to the bottom surface of the interposer, the inventive concept is not so limited and, e.g., a single packaged semiconductor chip may be mounted to the top surface and another single packaged semiconductor chip to the bottom surface, or a plurality of packaged semiconductor chips may be mounted to the bottom surface, or any combination thereof, etc.

Figure 4:
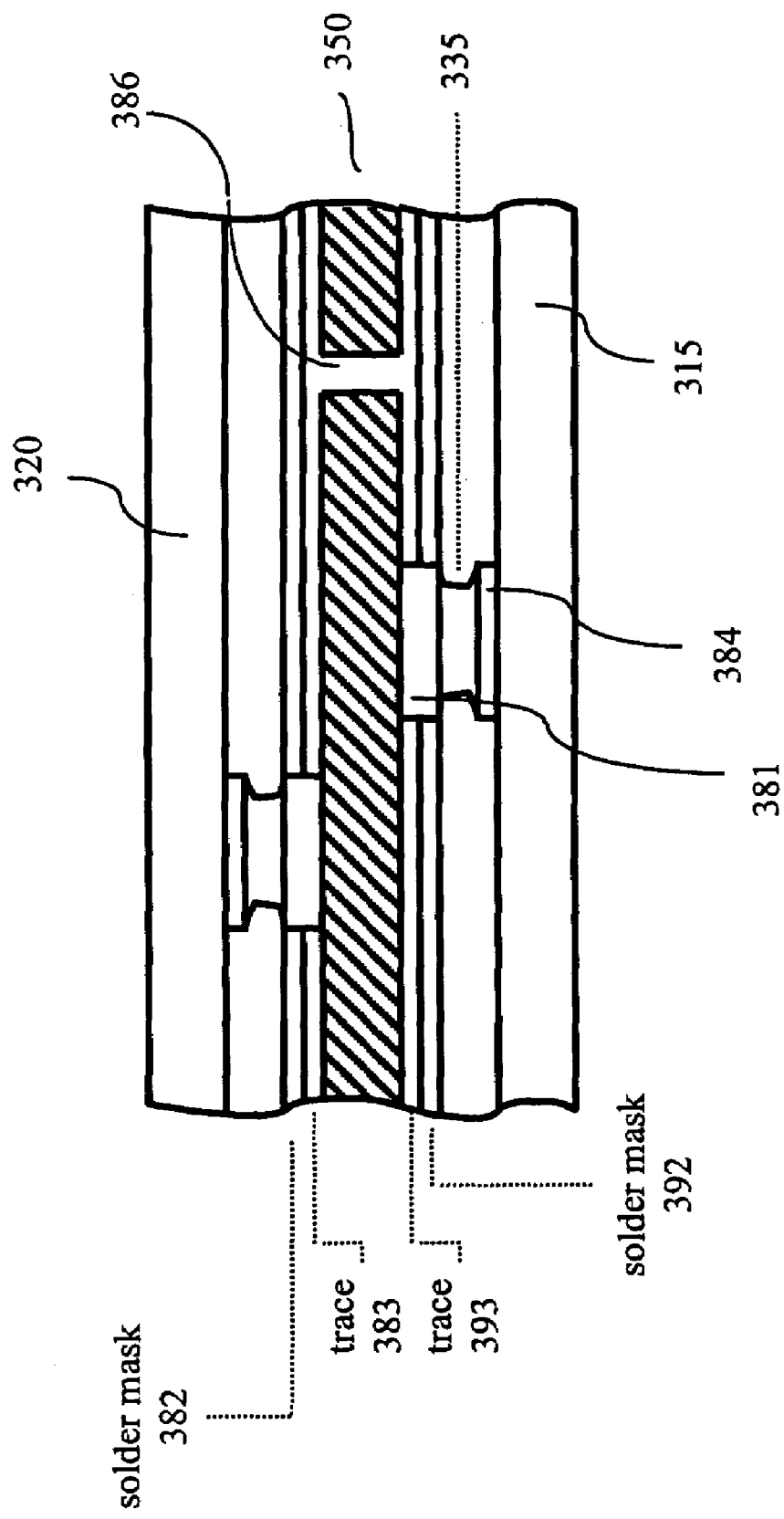
FIGS. 4 and 5 are illustrative cross-sections of a multi-chip module in accordance with the principles of the invention.

An illustrative cross-section 316 of the MCM of FIG. 3 is shown in FIG. 4. Traces may also extend along either, or both, of the top surface 351 and the bottom surface 352. Traces serve to interconnect the top connection pads with other conductive elements on the substrate. A solder mask layer may cover these traces and portions of the top and bottom surfaces. Illustratively, interposer 350 has two metal (or trace) layers. A trace layer 383 arranged on top surface 351, and a trace layer 393 arranged on bottom surface 352. Over these trace layers are solder mask layers 382 and 392, respectively. The mounting of a packaged semiconductor chip is further illustrated with reference to packaged semiconductor chip 315, which is mounted to interposer 350 via contact pad 384, solder bump 335 and contact pad 381. Illustratively, interposer 350 may further comprise vias, as represented by via 386. The contact, or connection, pads are of a type suitable for surface mounting and hence are formed from a solderable metal such as copper, preferably with a gold plating.

Figure 5:
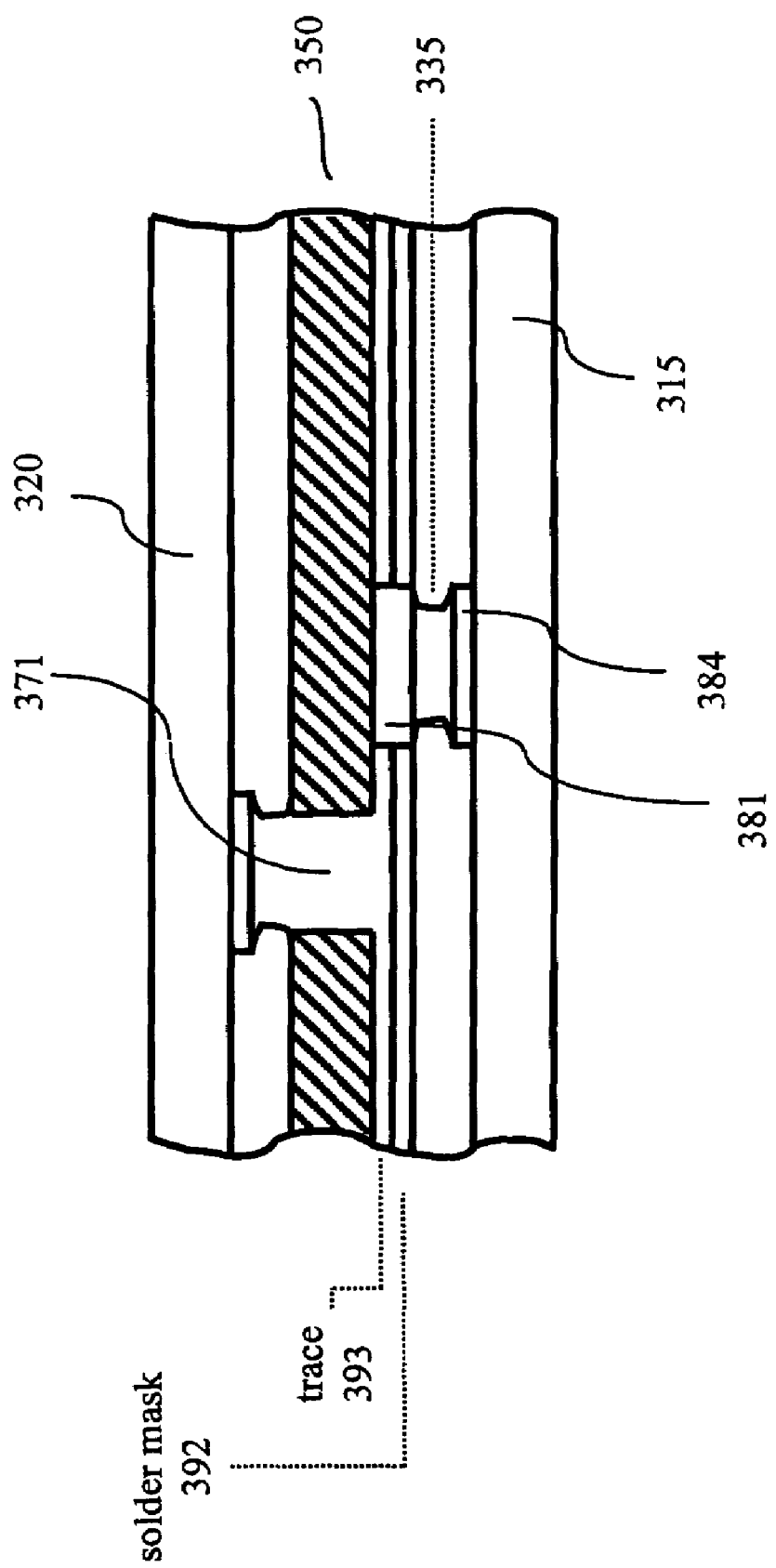

An alternative illustrative embodiment of the cross-section 316 of the MCM of FIG. 3 is shown in FIG. 5. In this illustration, interposer 350 has one metal layer as illustrated by representative trace layer 393 arranged on bottom surface 352. Over this trace layer is solder mask layer 392. The mounting of a packaged semiconductor chip is further illustrated with reference to packaged semiconductor chip 315, which is mounted to interposer 350 via contact pad 384, solder bump 335 and contact pad 381. Illustratively, packaged semiconductor chip 320 is electrically coupled to interposer 350 through via 371.

Figure 6:
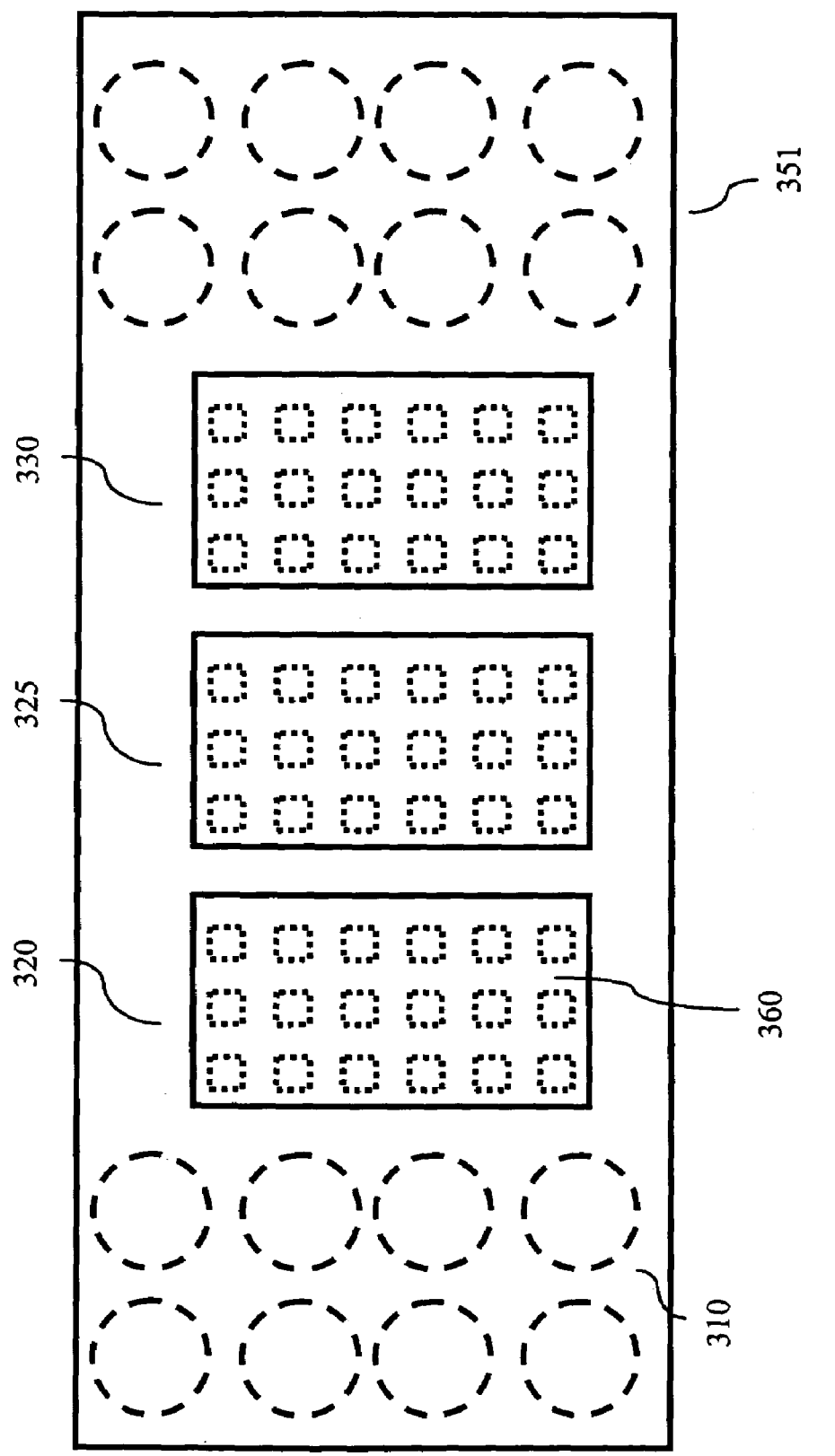
FIG. 6 is a diagrammatic top plan view of the multi-chip module of FIG. 3.

Turning now to FIG. 6, a diagrammatic top plan view of the multi-chip module of FIG. 3 is shown. Like numbers indicate similar elements. As shown, arrays of solder balls are mounted to the bottom surface as illustrated by use of the broken-line of, e.g., solder balls 310. The corresponding bond, or contact, pads are not shown. It should be noted that the number of solder balls shown in FIG. 6 is merely illustrative for the purposes of description. For example, a multi-chip module in accordance with the principles of the invention would typically have more solder balls than illustrated in FIG. 6, although there can be less solder balls than illustrated in FIG. 6. In addition, and in accordance with an aspect of the invention, each packaged semiconductor chip 320, 325 and 330 are mounted via a land grid array (LGA) pattern of bonding, or mounting, pads 360. In accordance with an aspect of the invention, the use of an LGA (versus, e.g., a ball grid array (BGA)) further lowers the height of multi-chip module 300. Although these mounting pads are arranged on top surface 351 they are not visible in this example—as represented by the dotted lines—due to being covered by the packaged semiconductor chips. As can be observed from FIG. 6, the mounting pads are arranged in the form of an array disposed at substantially constant distances from one another throughout the area occupied by the array. However, the array patterns may extend beyond one or more of the packaged semiconductor chips for use, e.g., as test points, etc.

Figure 7:
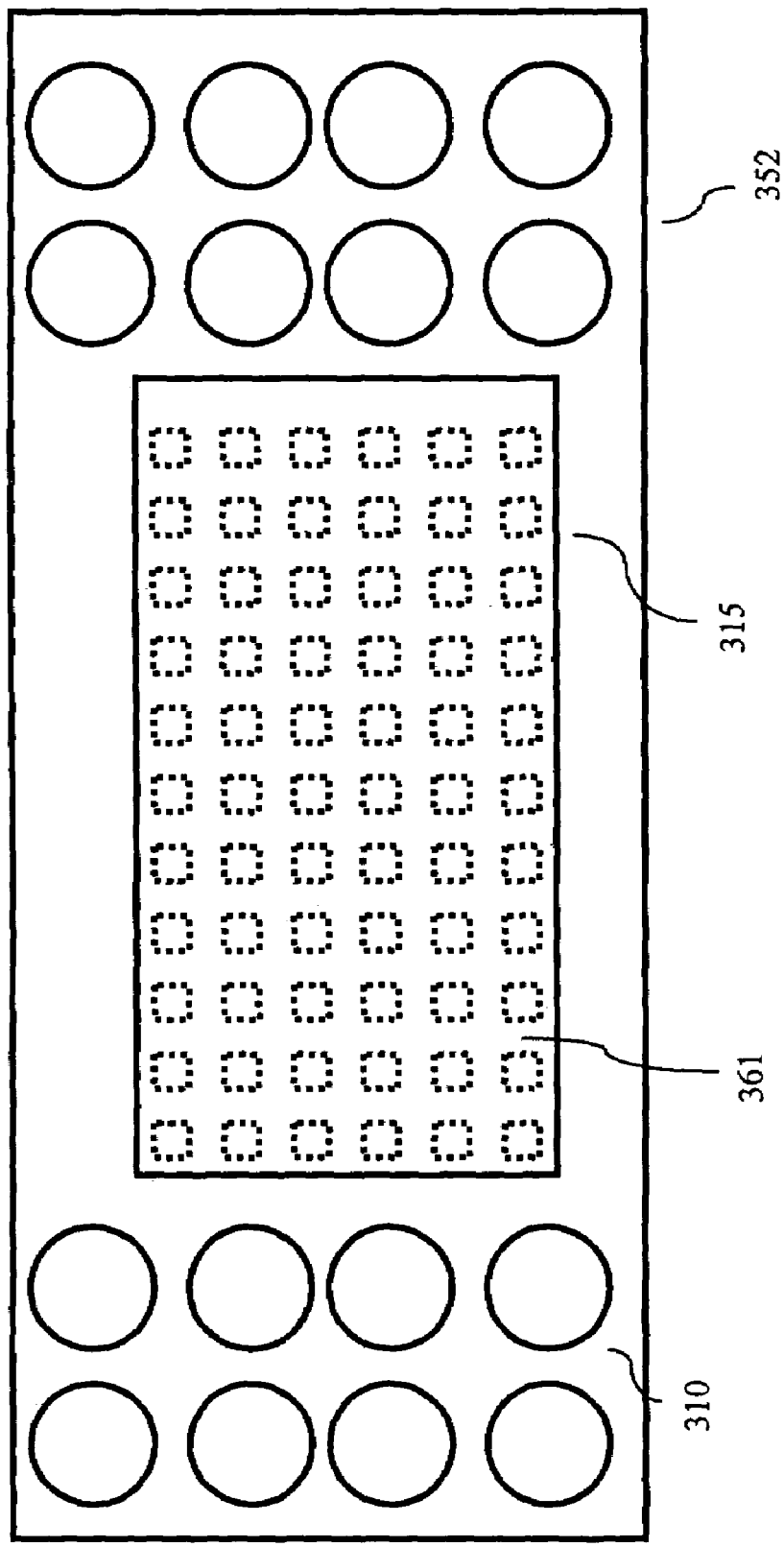
FIG. 7 is a diagrammatic bottom plan view of the multi-chip module of FIG. 3.

Turning now to FIG. 7, a diagrammatic bottom plan view of the multi-chip module of FIG. 3 is shown. In this view, the array of solder balls is arranged on the bottom surface 352. Like top surface 351, packaged semiconductor chip 315 is mounted to interposer 350 via an LGA connection utilizing bonding pads 361. Again, the pattern of the mounting pads on the bottom 351 of interposer 350 may extend beyond the area covered by packaged semiconductor chip 315.

Although not required for the inventive concept, other connection pads may also exist on the top surface 351 and the bottom surface 352 of interposer 350. These other connection pads may be in any configuration. Most preferably however pad configurations should be in accordance with a standard pad configuration, e.g., the above-mentioned LGA, commonly used in a circuit board for mounting components such as chips by a surface mounting procedure. Certain standard pad configurations are set by standard setting bodies including the Joint Electronic Device Engineering Counsel ("JEDEC") of the Electronics' Industry Alliance; by the Electronic Industry Association of Japan ("EIAJ") and by other standard setting bodies. As used in this disclosure, the term "official standard" refers to a standard adopted by a governmental or industry association, whereas the term "unofficial standard" refers to a package design which, although not conforming to an official standard has been adopted by numerous companies in the surface mounting industry.

Referring back to FIG. 3, it should be observed that no underfill is present in multi-chip module 350. As known in the art, underfill is an epoxy-type material that adds strength to the structure. However, and in accordance with an aspect of the invention, the lack of an underfill material—while weakening to some extent the overall mechanical stability of the structure—is less costly (e.g., this avoids the need for special processes, not commonly used in a board stuffing plant, to apply such an underfill) and enables any, or all, of the packaged semiconductor chips to be independently removed from the interposer 350 for repair purposes using standard circuit board rework techniques such as application of heat to melt the bonding material and replacement with other packaged chips. In other words, the packaged semiconductor chips can be detached from interposer 350 using conventional techniques without destroying the substrate. The term "removably connected," as used herein, refers to a connection, or mounting, that can be removed without destroying the substrate. Illustratively, a gap may be placed between the packaged chips to allow the placement of local heating repair tools to facilitate removal.

As such, in accordance with another aspect of the invention, the use of packaged chips in multi-chip module 300 facilitates testing even after assembly. As noted above, any packages that fail testing may, due to the lack of an underfill, be replaced—thus increasing the production yield for multi-chip modules of the type described herein.

In accordance with another aspect of the invention, the exposed die surface on the top of each packaged semiconductor chip is used to enhance thermal performance of the multi-chip module.

As described above, and in accordance with an aspect of the invention, an ultra thin system-in-a-package (SIP) with independent test and repair capability comprises an interposer having arranged on a top surface and a bottom surface thereof a number of packaged semiconductor chips connective using an LGA and wherein no underfill is used on the SIP. For example, in the illustration described above, a multi-chip module comprises four packaged semiconductor chips (three on the top surface of the interposer and one on the bottom surface of the interposer). Illustratively, the multi-chip module described herein can provide an extremely thin multi-chip package having an approximate height of 575 to 625 microns. This is illustrated by height H in FIG. 3. This assumes the following illustrative dimensions: the approximate packaged semiconductor thickness, or height, is 225 to 250 microns; the approximate diameter of solder bumps mounting the packaged semiconductor chips to either the top or bottom surface is 50 microns; and the interposer has an approximate width, or height, of 25 microns (e.g., a two metal layer, with solder masks on both the top surfaced and bottom surface). As can be observed from FIG. 3, and as noted earlier, the solder balls 310 should have a stand-off height that accommodates the presence of the bottom packaged semiconductor chip. As such, the actual height of the multi-chip module above a circuit board may be larger than the above-described approximate height of the multi-chip module.

By creating a multi-chip module, it is possible to reduce the required input/output interconnection to, e.g., a circuit board. For example, if the four packages have a total of 384 LGA bonding pads, some of these signals may only be required within the multi-chip module. As such, a reduction in the input/output signals to the circuit board may occur to, e.g., 106 signals, or 106 solder balls. Such a reduction in the input/output signaling provides a number of benefits. The input/output reduction increases the area available for mounting the bottom packaged semiconductor chip. In addition, along with the reduction in input/output signaling the routing of signaling on the circuit board itself is simpler than individually mounting each of the four packaged semiconductor chips on the circuit board. Finally, since the package-to-package interconnection on the interposer may be significantly shorter than the case where individual packages are surface mounted on the circuit board, higher electrical performance may be achieved.

It should also be noted that the LGA patterns used on the top surface and the bottom surface are formed on the same base material substrates. As such, there is no mismatch in the coefficient of thermal expansion (CTE) between the top and bottom of the substrate structure and this allows for LGA joints with small solder volume but still having high reliability.

Figure 8:
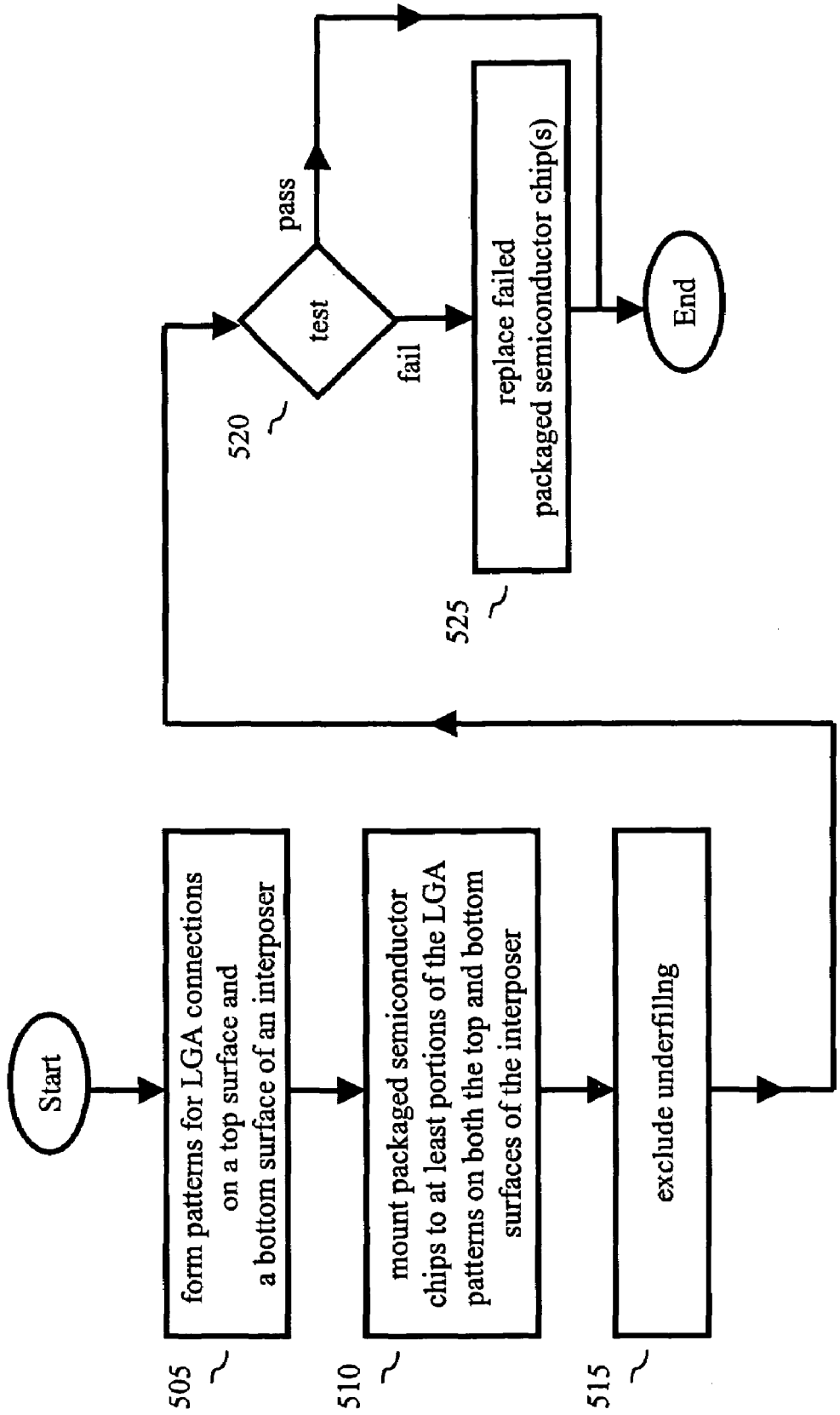
FIG. 8 is an illustrative flow chart for use in assembling a multi-chip module in accordance with the principles of the invention.

Another aspect of the invention relates to methods of making multi-chip assemblies of the types described herein. An illustrative flow chart is shown in FIG. 8 for creating a multi-chip module comprising an interposer, or substrate, having disposed on both a top surface and a bottom surface thereof a number of packaged semiconductor chips. In step 505, a pattern of mounting pads is placed on both surfaces of the interposer for forming LGA connections. It is not required that the patterns on the top and bottom surfaces be identical. It should be noted that other steps, such as forming conductive trace layers, vias, other mounting or testing pads have not been described herein. In step 510, a least one packaged semiconductor chip is mounted to at least a portion of the mounting pads on the top surface of the interposer and at least one packaged semiconductor chip is mounted on the bottom surface of the interposer over at least a portion of the bottom mounting pads. After the mounting in step 510, no underfilling of the mounted packaged semiconductor chips is performed as represented by step 515. As such, the packaged semiconductor chips are removably connected to the interposer. As noted above, this facilitates testing and repair of the MCM since a packaged semiconductor chip may be removed from the substrate and replaced with another packaged semiconductor chip of the same type. This is illustrated in steps 520 and 525. In step 520, a test of the packaged semiconductor chips of the MCM is performed. If the test fails, the failed packaged semiconductor chips are replaced in step 525 with other packaged semiconductor chips of the same type and, if necessary, the test may be repeated.

However, it should be noted that in some cases a multi-chip module of the kind described herein may, nevertheless, warp at room temperature. For example, even before the packaged semiconductor chips are mounted to interposer 350, a solder mask (as illustrated in FIGS. 4 and 5) is typically applied to interposer 350 at a temperature of 150° C. At this curing temperature, the interposer lies relatively flat. If the sizes of the solder mask on the top surface 351 and the solder mask on the bottom surface 352 are different—this size difference may be enough to cause interposer 350 to warp when the interposer subsequently cools to room temperature.

Figure 9:
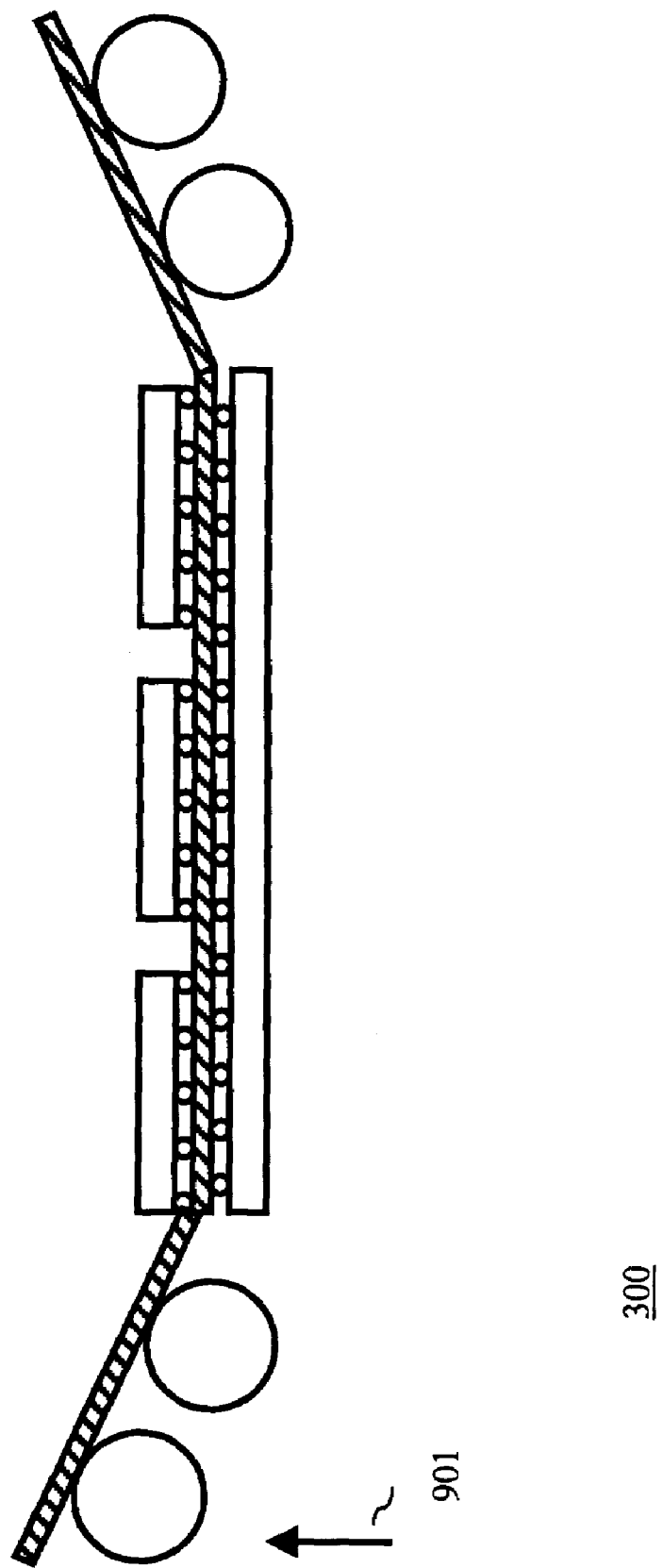
FIG. 9 is a diagrammatic view illustrating possible warpage of a multi-chip module.

In other words, in the manufacture of a multi-chip module as described herein various components are cured in a temperature range, or window, (e.g., 150° C. to 180° C.). As such, in this temperature range, the multi-chip module 300 lies relatively flat. However, upon cooling to room temperature, warping may occur in the interposer due to an imbalance caused by differing amounts of materials (and their attendant CTEs) on the top surface as compared to the amounts of materials (and their attendant CTEs) on the bottom surface. This warpage is illustrated in FIG. 9, which shows a multi-chip module 300 having a degree of warp at room temperature such that side portions of the interposer bend in an upward direction as illustrated by arrow 901. It should be noted that the warpage may occur in either an upward or a downward direction. Indeed, one side of the multi-chip module may warp in an upwardly fashion, while the other side of the multi-chip module may warp in a downwardly fashion.

Figure 10:
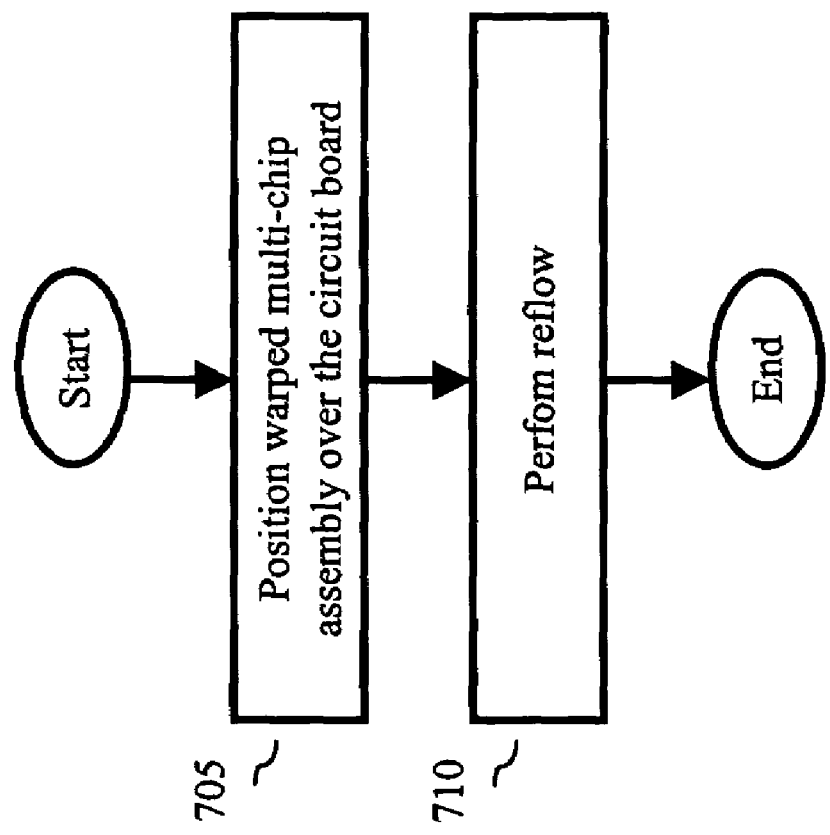
FIG. 10 is an illustrative flow chart for use in mounting a multi-chip module in accordance with the principles of the invention.
Figure 11:
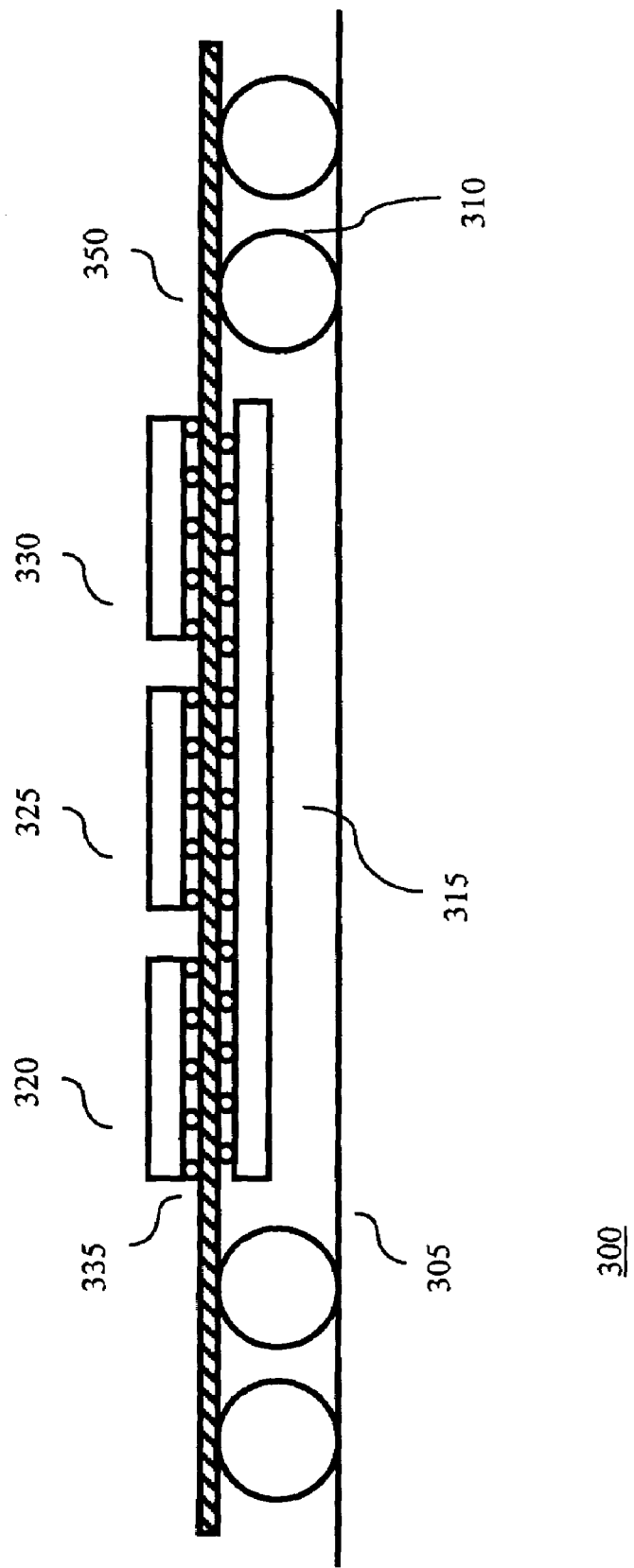
FIG. 11 is a diagrammatic view illustrating mounting of a multi-chip module to a portion of a circuit board.

As such, it is necessary to remove any warpage in the multi-chip module in order to mount the multi-chip module to a circuit board. Therefore, and in accordance with another aspect of the invention, an illustrative flow chart for mounting a multi-chip module is shown in FIG. 10. In step 705, a warped multi-chip module is positioned over a portion of a circuit board for attachment thereto. In step 710, reflow is performed for mounting the multi-chip module to the circuit board via solder balls 310. The reflow process raises the temperature of the warped multi-chip module to a temperature at least within, or above, a predefined temperature window. This predefined temperature window includes temperatures at which components such as solder masks were cured, packaged semiconductor chips mounted, etc. As such, the multi-chip module will "relax" and become relatively flat for mounting to the circuit board. A diagrammatic view illustrating the mounting of a multi-chip module 300 to a portion of a circuit board 305 is shown in FIG. 11.

The multi-chip module 300 occupies significantly less area on the top surface of circuit board 305 than would be required to mount packaged semiconductor chips 315, 320, 325 and 330 separately to the circuit board. Also, interconnections between these packaged semiconductor chips incorporated in this assembly are routed through the traces of interposer 350 and, accordingly, need not be accommodated by traces in circuit board 305 itself. This reduces the complexity of the interconnections required in the circuit board. In some cases, this can reduce the number of layers required in circuit board 305 as a whole. The assembly, and assembly method thus has advantages similar to those achievable in a stacked chip arrangement where bare dies are specially mounted in a stacked configuration. However, packaged chips 315, 320, 325 and 330 need not be provided in special packaging arrangements, but instead are standard chips of the type normally used for mounting directly to a circuit board. Many types of chips are available in standard, packaged configurations in great quantities and at low prices from numerous sources. For example, memory chips are available in standard packaged configurations from numerous manufacturers.

It should be noted that after cooling to room temperature, there will be some strain present in the mounted multi-chip module on the circuit board. However, the solder balls (e.g., solder balls 310) will maintain mechanical (and electrical) contact with the circuit board. In other words, the surface tension and bonding of the multi-chip module via the solder balls to the circuit board is greater than the amount of strain present in the multi-chip module.

Figure 12:
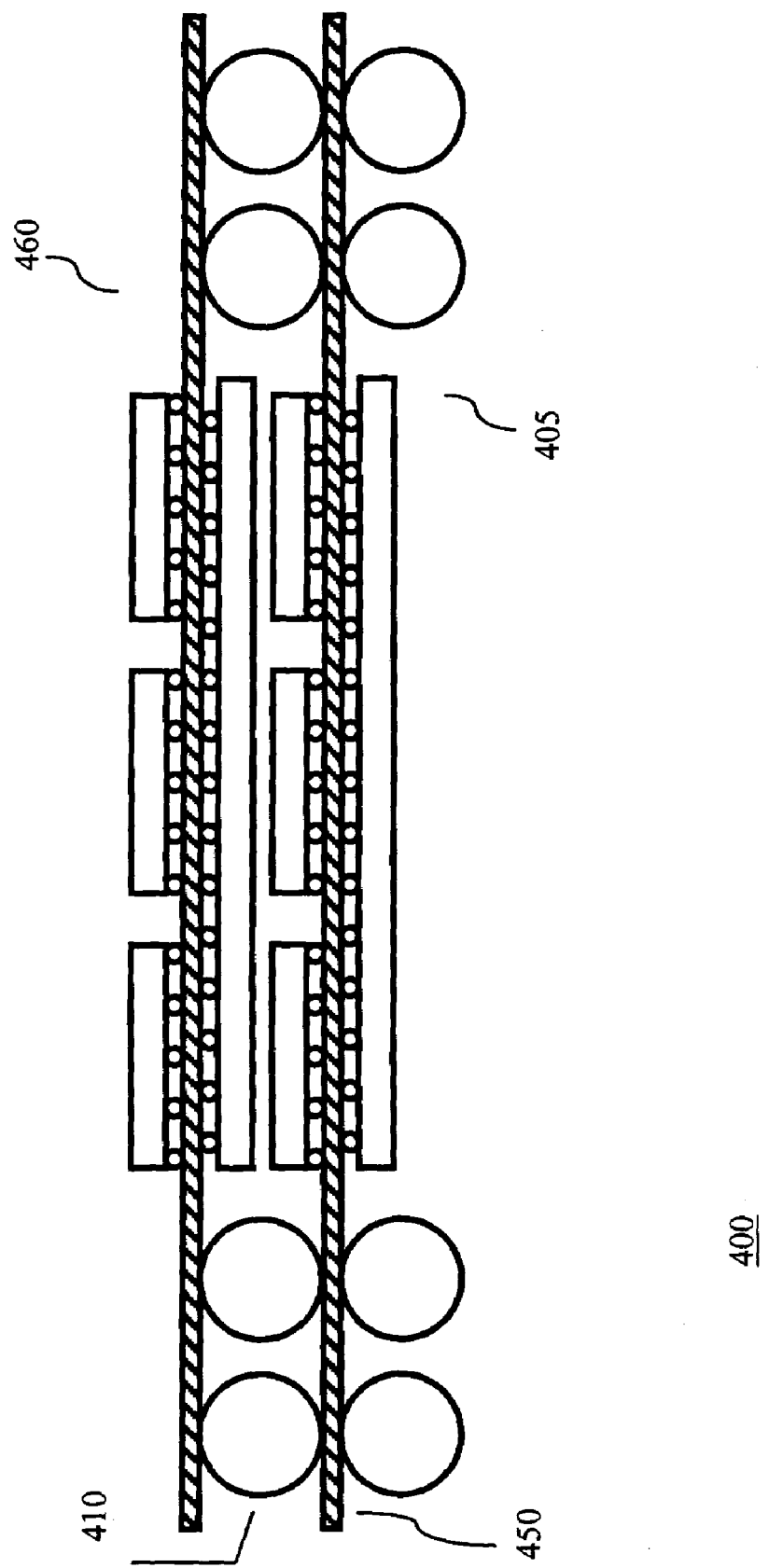
FIG. 12 is a diagrammatic view of a stacked multi-chip module in accordance with the principles of the invention.

In another aspect of the invention, a stacked multi-chip module can be developed with the basic elements of the multi-chip module described herein. This is illustrated in FIG. 12, which shows an illustrative stacked assembly 400 comprising two multi-chip assemblies 405 and 460. It should be noted that a stacked multi-chip module may comprise more than two multi-chip assemblies. Interposer 450 of the lower multi-chip module 405 has corresponding mounting pads, or vias, (not shown) for mounting thereto solder balls 410 of upper multi-chip module 460. The stacked assembly 400 is mounted to a circuit board as described above. It should be noted that a stacked multi-chip module may include a mixture of multi-chip modules of the type described herein and other forms of multi-chip modules. For example, a stacked multi-chip module may include at least one multi-chip module of the type described herein and one, or more, other types of multi-chip modules.

It should be noted that a mechanically weak but flat interposer and package substrates provide the benefit of using single alloy based joint material. This may provide for a simpler assembly process with low reflow temperature (230° C.) and single reflow temperature profile. In addition, it may provide for the avoidance of high temperature driven reliability issues, such as intermetallics formation with fast diffusion mechanisms.

It should be noted that other forms of bonding material may be used. For example, a eutectic bonding material or other known conductive bonding material. Rather than discrete masses of a conductive bonding material, an anisotropic conductive material may be applied as a layer between a packaged semiconductor chip and a surface of the substrate. As is known in the art, such an anisotropic material will conduct appreciably in the direction through the layer but does not have appreciable conduction in directions along the plane of the layer.

In the foregoing description, terms such as "top," "bottom," "upwardly" and "downwardly" refer to the frame of reference of the microelectronic element, unit or circuit board. These terms do not refer to the normal gravitational frame of reference.

As used in this disclosure, a terminal or other conductive feature is regarded as "exposed at" a surface of a dielectric element where the terminal is arranged so that all or part of the conductive feature can be seen by looking at such surface. Thus, a conductive feature which is exposed at a surface of a dielectric element may project from such surface; may be flush with such surface; or may be recessed from such surface and exposed through an opening extending entirely or partially through the dielectric element.

The disclosure of co-pending, commonly assigned, U.S. Provisional Patent Application Ser. No. 60/408,644, filed Sep. 6, 2002, entitled "COMPONENTS, METHODS AND ASSEMBLIES FOR STACKED PACKAGES," and U.S. patent application Ser. No. 10/656,534, filed Sep. 5, 2003, are hereby incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A multi-chip module comprising:
   an interposer having a top surface and a bottom surface, each surface having mounting pads arranged thereon in an array pattern;
   at least one first packaged semiconductor chip mounted to the interposer, the first packaged semiconductor chip including a dielectric package substrate and a plurality of contact pads disposed on the dielectric package substrate, the contact pads mounted to at least a portion of the mounting pads arranged on the top surface of the interposer through mounting masses disposed between the dielectric package substrate and the interposer; and
   at least one second packaged semiconductor chip mounted to the interposer, the second packaged semiconductor chip including a dielectric package substrate and a plurality of contact pads disposed on the dielectric package substrate, the contact pads mounted to at least a portion of the interposer through mounting masses disposed between the dielectric package substrate and the interposer.

2. The multi-chip module of claim 1, wherein the mounting pads and the mounting masses are in accordance with a Land Grid Array (LGA).

3. The multi-chip module of claim 1, wherein the mounted packaged semiconductor chips on the top surface and the bottom surface lack the presence of an underfill between the dielectric package substrates and the interposer.

4. The multi-chip module of claim 1 wherein the interposer has a thickness in a direction of a height of the multi-chip module no greater than 75 microns.

5. The multi-chip module of claim 1 wherein the interposer has a thickness in a direction of a height of the multi-chip module no greater than 40 microns.

6. The multi-chip module of claim 1 wherein the interposer has a thickness in a direction of a height of the multi-chip module no greater than 25 microns.

7. The multi-chip module of claim 1, wherein the multi-chip module has a thickness in a direction of its height of no greater than approximately 625 microns.

8. The multi-chip module of claim 1, wherein the mounting masses are solder bumps having a thickness in a direction of a height of the multi-chip module of no greater than approximately 60 microns.

9. The multi-chip module of claim 1, wherein the bottom surface of the interposer further comprises a plurality of bonding pads for attaching thereto a corresponding plurality of solder balls for use in bonding the multi-chip module to a circuit board.

10. The multi-chip module of claim 9, further comprising the circuit board.

11. The multi-chip module of claim 1, wherein at least one of the first and second packaged semiconductor chips has a top surface formed from a top surface of a bare chip within the packaged semiconductor chip for enhancing thermal performance of the multi-chip module.

12. The multi-chip module according to claim 1, wherein the first packaged semiconductor chip is removably mounted to the interposer.

13. The multi-chip module according to claim 12, wherein the second packaged semiconductor chip is removably mounted to the interposer.

14. A multi-chip assembly for mounting to a circuit board, the multi-chip assembly comprising:
an interposer having a top surface and a bottom surface, each surface having mounting pads arranged thereon in a land grid array (LGA) format, the interposer having a thickness in a direction of a height of the multi-chip assembly of no greater than approximately 25 microns;
at least one first packaged semiconductor chip mounted via mounting masses to at least a portion of the mounting pads arranged on the top surface of the interposer,; and
at least one second packaged semiconductor chip mounted via mounting masses to at least a portion of the mounting pads arranged on the bottom surface,;
wherein at least the mounting pads arranged on the top surface of the interposer in the Land Grid Array (LGA) format are disposed between the top surface and the first packaged chip or the mounting pads arranged on the bottom surface of the interposer in the Land Grid Array (LGA) format are disposed between the bottom surface and the second packaged chip
wherein the mounted packaged semiconductor chips on the top surface and the bottom surface lack the presence of an underfill material.

15. The multi-chip module of claim 14, wherein the bottom surface of the interposer further comprises a plurality of bonding pads for attaching thereto a corresponding plurality of solder balls for use in bonding the multi-chip module to a circuit board.

16. The multi-chip module of claim 14, wherein at least one of the packaged semiconductor chips has a top surface formed from a top surface of a bare chip within the packaged semiconductor chip for enhancing thermal performance of the multi-chip module.

17. A stacked multi-chip module for mounting to a circuit board, the stacked multi-chip module comprising:
a plurality of multi-chip modules including a first multi-chip module and a second multi-chip module, the first multi-chip module electrically and mechanically bonded to the second multi-chip module and wherein the first multi-chip module further comprises
an interposer having a top surface and a bottom surface, each surface having mounting pads arranged in an array format;
at least one first packaged semiconductor chip mounted to at least a portion of the mounting pads arranged on the top surface, wherein the mounting pads are disposed between the at least one first packaged semiconductor chip and the top surface of the interposer; and
at least one second packaged semiconductor chip mounted to at least a portion of the mounting pads arranged on the bottom surface;
wherein, the mounted packaged semiconductor chips on the top surface and the bottom surface lack the presence of an underfill material.

18. The stacked multi-chip module of claim 17 wherein the mounting pads and mounting masses are in accordance with a Land Grid Array (LGA).

19. The stacked multi-chip module of claim 17, wherein the first multi-chip module has a thickness in a direction of a height of the first multi-chip module of less than approximately 625 microns.

20. The stacked multi-chip module of claim 17, wherein the mounting masses include solder bumps no greater than approximately 60 microns in height.

21. The stacked multi-chip module of claim 17, wherein the bottom surface of the interposer further comprises a plurality of bonding pads for attaching thereto a corresponding plurality of solder balls for use in bonding the stacked multi-chip module to a circuit board.

22. The stacked multi-chip module of claim 21, further comprising the circuit board.

23. The stacked multi-chip module of claim 17, wherein at least one of the packaged semiconductor chips has a top surface formed from a top surface of a bare chip within the packaged semiconductor chip for enhancing thermal performance of the stacked multi-chip module.

24. The multi-chip module of claim 14, further comprising the plurality of solder balls, the solder balls having a stand off height from the interposer sufficient to permit mounting the multi-chip module to the circuit board when the circuit board is disposed underneath the second packaged semiconductor chip.

25. The multi-chip module of claim 24, further comprising a circuit board, the terminals of the circuit board bonded to the bonding pads of the interposer through a plurality of solder balls.

26. The multi-chip assembly according to claim 14, wherein the at least one first packaged semiconductor chip has a thickness in the direction of the height of no greater than approximately 250 microns.

27. The multi-chip assembly according to claim 26, wherein the at least one second packaged semiconductor chip has a thickness in the direction of the height of no greater than approximately 250 microns.

* * * * *